(12) United States Patent
Cheng et al.

(10) Patent No.: US 7,439,149 B1
(45) Date of Patent: Oct. 21, 2008

(54) STRUCTURE AND METHOD FOR FORMING SOI TRENCH MEMORY WITH SINGLE-SIDED STRAP

(75) Inventors: Kangguo Cheng, Beacon, NY (US); Ramachandra Divakaruni, Ossining, NY (US); Herbert L. Ho, New Windsor, NY (US); Geng Wang, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/861,704

(22) Filed: Sep. 26, 2007

(51) Int. Cl.
*H01L 21/20* (2006.01)

(52) U.S. Cl. .............................. 438/386; 257/E21.396

(58) Field of Classification Search .................. 438/386
See application file for complete search history.

(56) References Cited

U.S. PATENT DOCUMENTS

| | | | |
|---|---|---|---|
| 5,525,531 A * | 6/1996 | Bronner et al. ............. 438/152 |
| 6,426,526 B1 | 7/2002 | Divakaruni et al. |
| 6,498,061 B2 | 12/2002 | Divakaruni et al. |
| 6,573,137 B1 | 6/2003 | Divakaruni et al. |
| 6,872,629 B2 | 3/2005 | Hsiao et al. |
| 7,019,350 B2 | 3/2006 | Hsu |
| 7,078,307 B2 | 7/2006 | Lin et al. |

* cited by examiner

*Primary Examiner*—W. David Coleman
(74) *Attorney, Agent, or Firm*—Cantor Colburn LLP; Joseph Petrokaitis

(57) ABSTRACT

A method of forming a trench memory cell includes forming a trench capacitor within a substrate material, the trench capacitor including a node dielectric layer formed within a trench and a conductive capacitor electrode material formed within the trench in contact with the node dielectric layer; forming a strap mask so as cover one side of the trench and removing one or more materials from an uncovered opposite side of the trench; and forming a conductive buried strap material within the trench; wherein the strap mask is patterned in a manner such that a single-sided buried strap is defined within the trench, the single-sided buried strap configured in a manner such that the deep trench capacitor is electrically accessible at only one side of the trench.

1 Claim, 10 Drawing Sheets

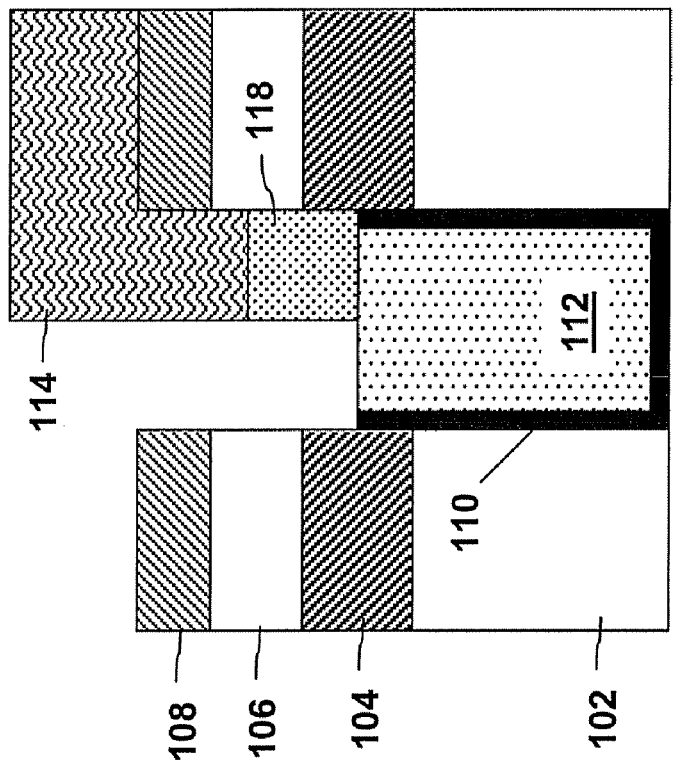
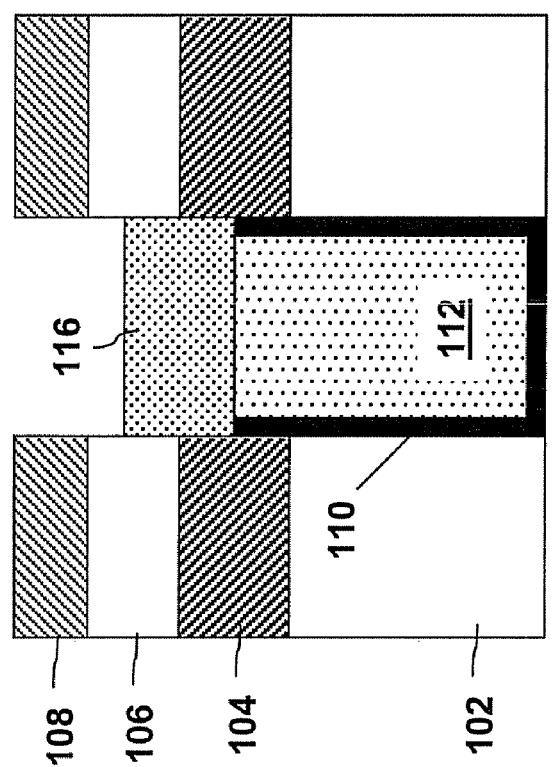
Fig. 2(d)
Fig. 2(c)

STRUCTURE AND METHOD FOR FORMING SOI TRENCH MEMORY WITH SINGLE-SIDED STRAP

BACKGROUND

The present invention relates generally to semiconductor device processing techniques, and, more particularly, to a structure and method of forming silicon-on-insulator (SOI) trench memory with a single-sided buried strap.

Dynamic random access memory (DRAM) cells include two main components, a storage capacitor that is used to store a binary data bit in the form of an electric charge and an access transistor that is used to transfer the electric charge to and from the storage capacitor. Typically, a first voltage is stored on the capacitor to represent a logic HIGH or binary "1" value (e.g., $V_{DD}$), while a second voltage on the storage capacitor represents a logic LOW or binary "0" value (e.g., ground). The storage capacitor may be either planar on the surface of the semiconductor substrate or trench etched into the semiconductor substrate. In the semiconductor industry (where there is an increased demand for memory storage capacity accompanied with an ever decreasing chip size), the trench storage capacitor layout is favored over the planar storage capacitor design since this particular arrangement results in a dramatic reduction in the space required for the capacitor without sacrificing capacitance.

One of the more delicate aspects of DRAM cell fabrication is the electrical connection made between the trench storage capacitor and the access transistor. Such a contact is often referred to in the art as a "buried strap," which is formed at the intersection of one electrode of the storage trench capacitor and one source/drain junction of the access transistor. In a "cross-point" DRAM array configuration, bit lines and word lines crisscross the array in a perpendicular fashion such that a storage capacitor is located at each word line/bit line intersection. However, each storage capacitor in a cross-point array typically must be accessible from only one side of the deep trench; otherwise, the "one word line, one bit line, one memory bit" rule would be violated. Thus, an interconnection is formed between the storage capacitor and a vertical sidewall portion of the deep trench, while the deep trench is isolated along all other sidewall portions.

Present approaches to forming a single-sided buried strap include (in part) performing angled ion implantation into a layer of deposited silicon within the deep trench, thereby leaving the silicon layer one side of the deep trench un-implanted. The un-implanted silicon is then etched using an etch selective material with respect to the doped (implanted) portion of the silicon, which thereby acts as a sacrificial mask that is subsequently removed.

One drawback associated with angled ion implantation is the complexity associated therewith, given the deposition and etching of multiple sacrificial materials. In addition, process control also becomes a factor in the angled ion implantation approach to single-sided strap formation. Accordingly, it is desirable to be able form trench memory devices on an SOI substrate (for example) with a single-sided strap in a cost effective and robust manner.

SUMMARY

The foregoing discussed drawbacks and deficiencies of the prior art are overcome or alleviated, in an exemplary embodiment, by a method of forming a trench memory cell, including forming a trench capacitor within a substrate material, the trench capacitor including a node dielectric layer formed within a trench and a conductive capacitor electrode material formed within the trench in contact with the node dielectric layer; forming a strap mask so as cover one side of the trench and removing one or more materials from an uncovered opposite side of the trench; and forming a conductive buried strap material within the trench; wherein the strap mask is patterned in a manner such that a single-sided buried strap is defined within the trench, the single-sided buried strap configured in a manner such that the deep trench capacitor is electrically accessible at only one side of the trench.

In another embodiment, a method of forming a trench memory device includes forming a trench capacitor within a silicon-on-insulator (SOI) substrate, the trench capacitor including a node dielectric layer formed within a trench and a trench polysilicon material formed within the trench in contact with the node dielectric layer, the trench polysilicon material serving as a capacitor electrode; forming a strap mask so as cover one side of the trench; recessing the exposed side of the trench polysilicon material, down to a level at least below an SOI layer of the SOI substrate; removing a portion of the node dielectric layer exposed by the recessing of the trench polysilicon; filling a volume of the trench vacated by the removed portion of the node dielectric layer and recessed trench polysilicon material with a polysilicon buried strap material; and following removal of the strap mask, further recessing previously covered portions of the trench polysilicon material and the polysilicon buried strap material, thereby defining a single-sided buried strap.

In still another embodiment, a method of forming a trench memory device includes forming a trench capacitor within a silicon-on-insulator (SOI) substrate, the trench capacitor including a node dielectric layer formed within a trench and a trench polysilicon material formed within the trench in contact with the node dielectric layer, the trench polysilicon material serving as a capacitor electrode; recessing both the trench polysilicon material and the node dielectric material within the trench; forming a polysilicon buried strap material over the recessed trench polysilicon material and node dielectric material within the trench; forming a strap mask so as cover one side of the trench; removing the exposed portion of the polysilicon buried strap material so as to define a single-sided buried strap; and filling a volume of the trench vacated by the removed portion of the conductive buried strap material with an insulating material.

BRIEF DESCRIPTION OF THE DRAWINGS

Referring to the exemplary drawings wherein like elements are numbered alike in the several Figures:

FIGS. 2(a) through 2(f) are a series of cross sectional views illustrating a method of forming an SOI trench memory device with a single-sided buried strap, in accordance with an alternative embodiment of the invention.

DETAILED DESCRIPTION

Disclosed herein is a structure and method of forming an SOI trench memory with a single-sided buried strap. Briefly stated, the present embodiments avoid the use of angled ion implantation in forming a single-sided strap through the use of a strap mask material that is patterned over one side of the deep trench devices of the memory. In one embodiment, the strap mask is formed and patterned in order to remove the cell node dielectric from one side of the trench prior to forming the strap polysilicon material. In another exemplary embodiment, the strap mask is formed and patterned in order to remove the previously formed strap polysilicon material from one side of the deep trench devices.

Figure 1A:
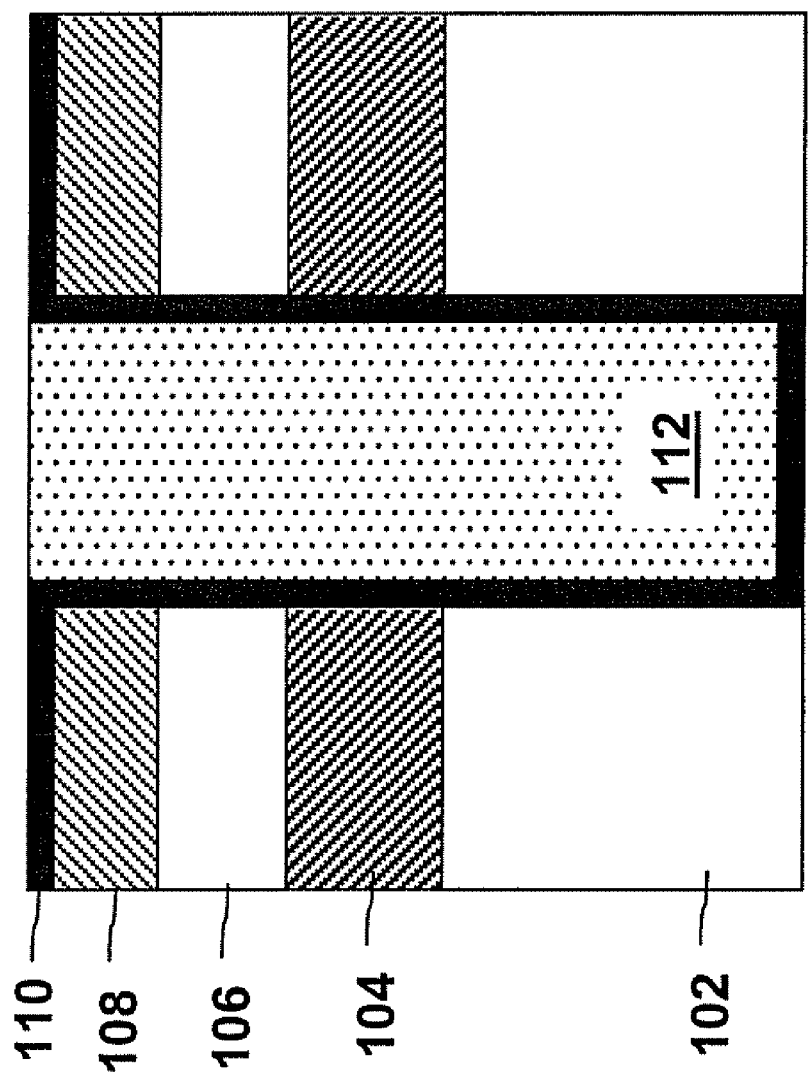
FIGS. 1(a) through 1(h) are a series of cross sectional views illustrating a method of forming an SOI trench memory device with a single-sided buried strap, in accordance with an embodiment of the invention.

Referring initially to FIGS. 1(a) through 1(h), there are shown a series of cross sectional views illustrating a method of forming an SOI trench memory device with a single-sided buried strap, in accordance with an embodiment of the invention. As shown in FIG. 1(a), a bulk semiconductor substrate (e.g., silicon) 102 has a buried insulating layer (e.g., buried oxide (BOX) layer) 104 formed thereon, followed by a relatively thin SOI layer 106 formed on the BOX layer 104 and a pad layer 108 (e.g., a pad nitride layer with an optional underlying oxide layer) formed on the SOI layer 106. It should be noted at this point that although the exemplary embodiments described herein are presented in terms of SOI devices, the embodiments are equally applicable to deep trench memory devices formed on other types of substrates, such as bulk substrates for example. In accordance with deep trench memory processing techniques, a cell capacitor is formed by creating a deep trench through the pad nitride layer 108, the SOI layer 106, the BOX layer 104 and into the bulk substrate 102. As will be recognized by one skilled in the art, a deep trench capacitor includes a thin node dielectric layer 110 formed along sidewalls and the bottom surface of the deep trench, as well as a conductive fill material 112 (e.g., doped polysilicon, and/or a metal) that serves as one of the capacitor electrodes. The bulk substrate 102 or a doped buried plate region formed therein (not shown) comprises the other capacitor electrode.

Figure 1B:
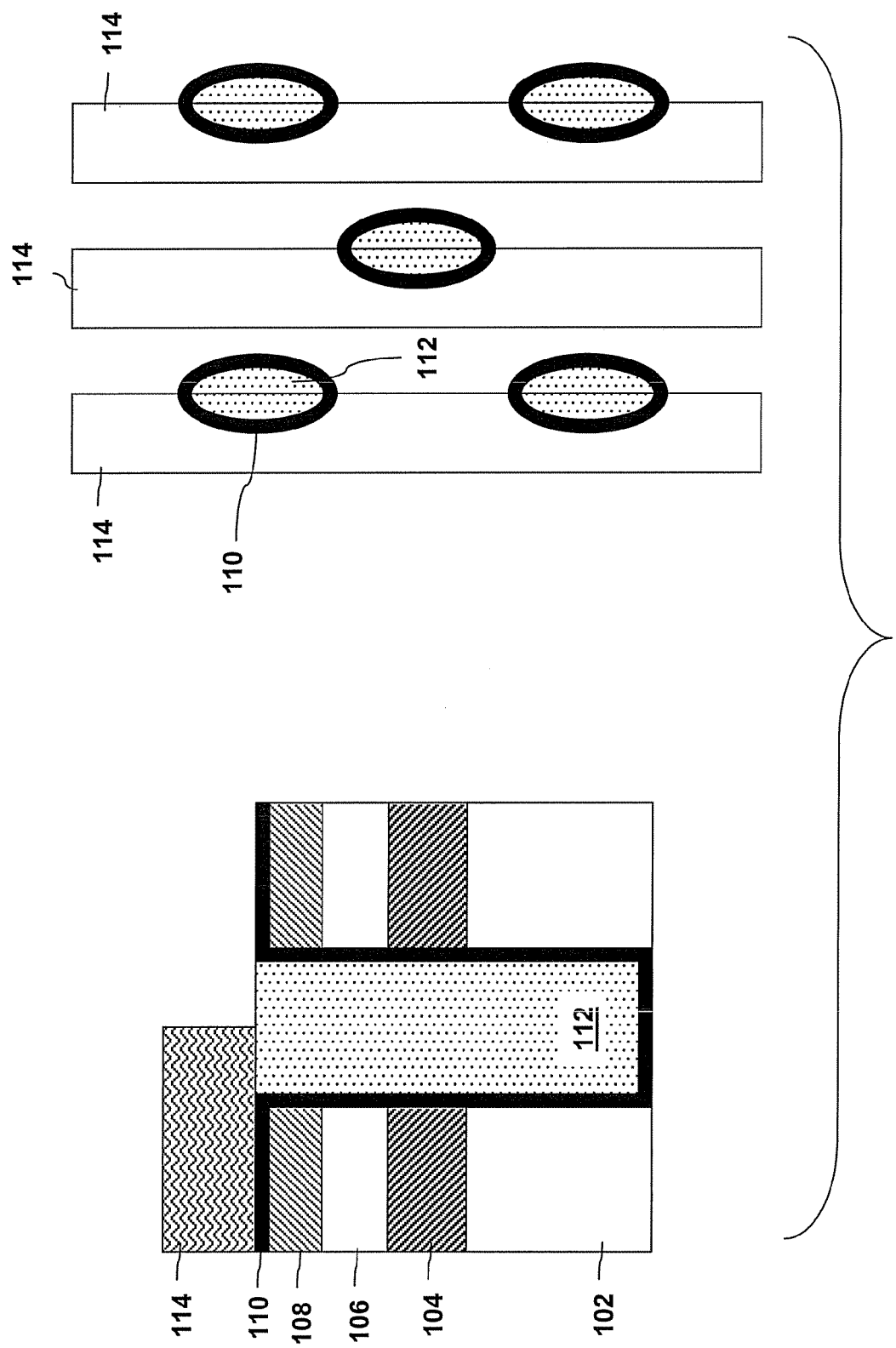
Figure 1D:
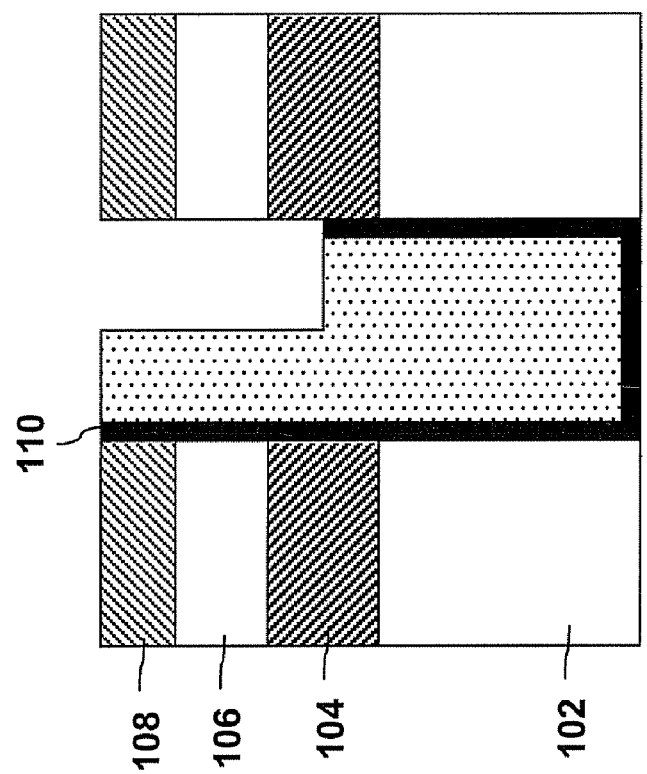
Figure 1C:
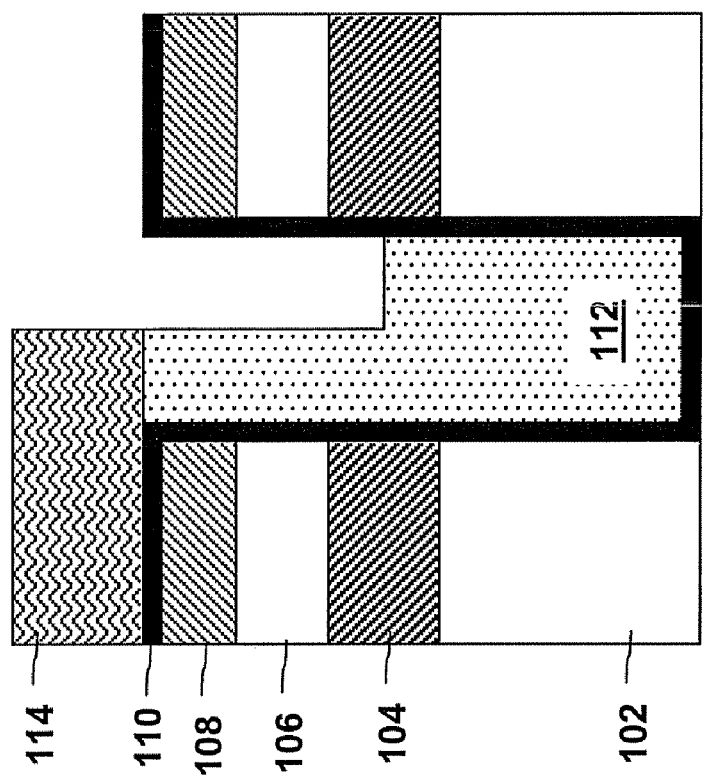

In lieu of angled ion implantation to form a single-sided buried strap, FIG. 1(b) illustrates the formation of a strap mask 114 that is patterned in a manner that exposes one side of the deep trenches. A portion of FIG. 1(b) also illustrates a top view of the patterned strap mask 114 with respect to a plurality of the deep trenches. Then, as shown in FIG. 1(c), a portion of the exposed polysilicon fill material 112 is removed from the trench, by etching for example. The etching is performed to recess the polysilicon fill material 112 to a level at least through the entire thickness of the SOI layer 106, so as to enable complete contact between the subsequently formed strap and the SOI layer 106. In FIG. 1(d), the strap mask 114 is removed, followed by removal the exposed portions of the node dielectric layer 110 on the trench sidewalls and top of the pad nitride layer 108. In so doing, the node dielectric layer 110 remains on one the side of the trench to isolate the capacitor from one side of the SOI layer 106, while being removed on the other side to allow for buried strap contact between the capacitor and the other side of the SOI layer 106.

Figure 1F:
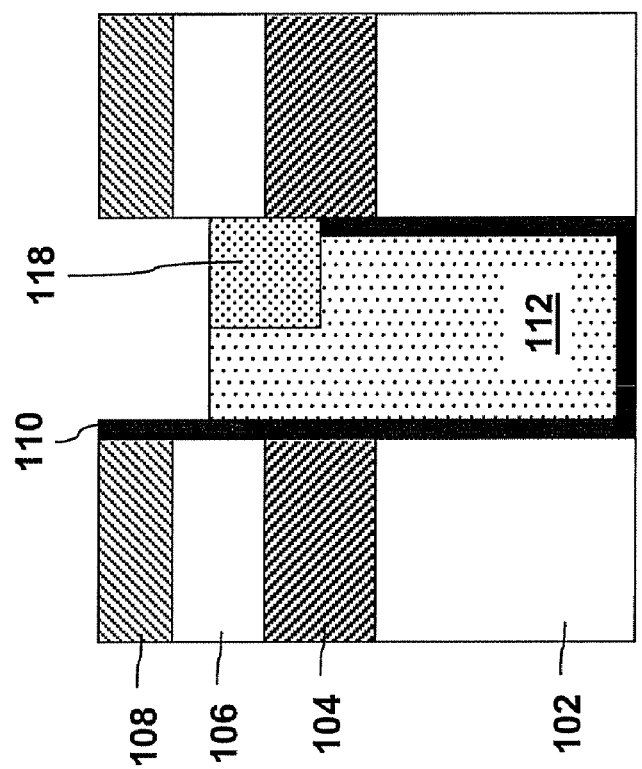
Figure 1E:
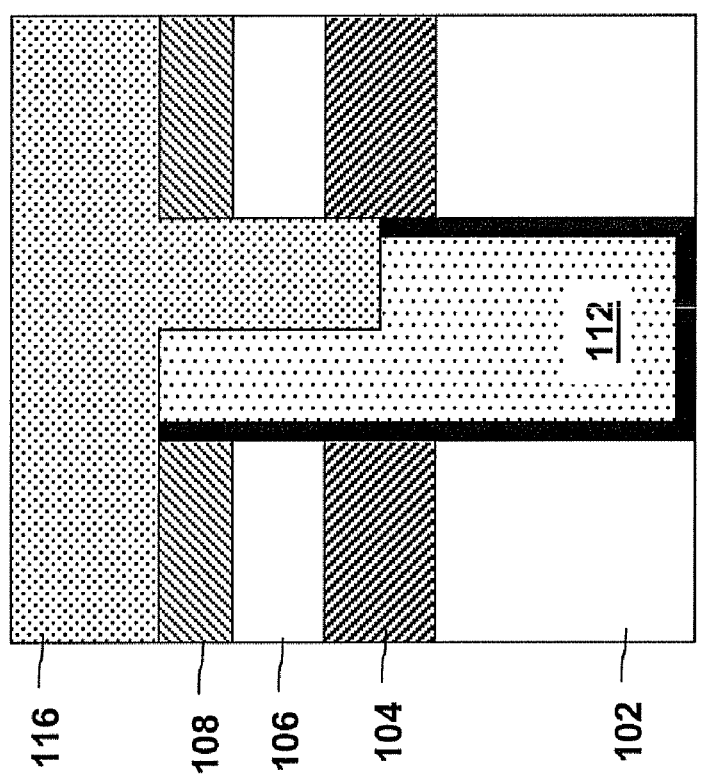
Figure 1H:
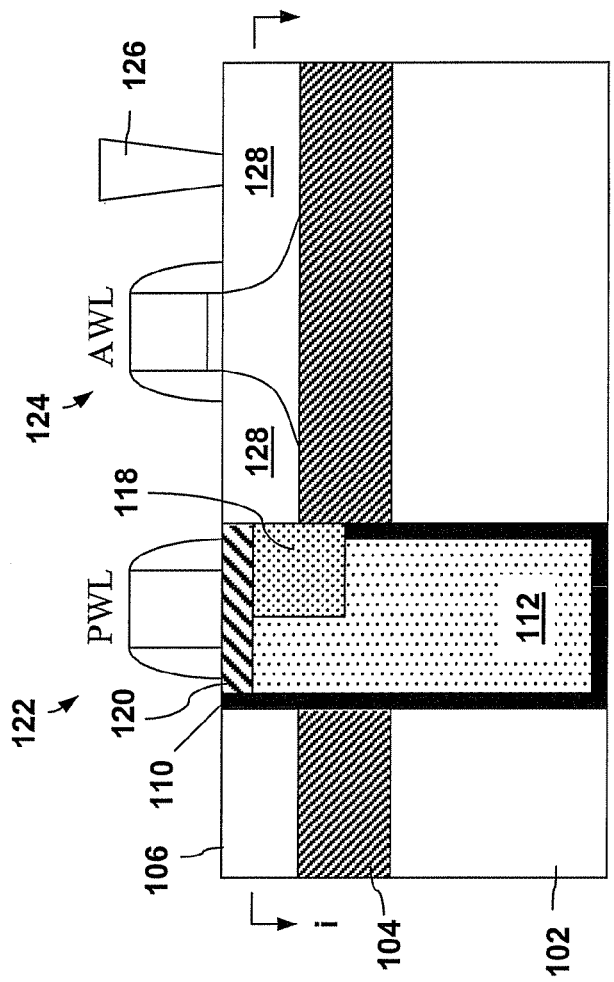

Referring next to FIG. 1(e), a layer of conductive buried strap material 116 (e.g., doped polysilicon) is formed within the recess created by the partial fill and node dielectric material removal shown in FIGS. 1(c) and 1(d). In FIG. 1(f), both the deep trench fill polysilicon material 112 and the buried strap polysilicon material 116 are recessed to a level just below the bottom of the pad nitride layer 108, thereby defining a single-sided buried strap 118. Whereas the buried strap 118 is in electrical contact with the SOI layer 106 on one side of the trench, the remaining node dielectric layer 110 isolates the deep trench polysilicon material 112 from the SOI layer 106 on the other side of the trench.

Figure 1G:
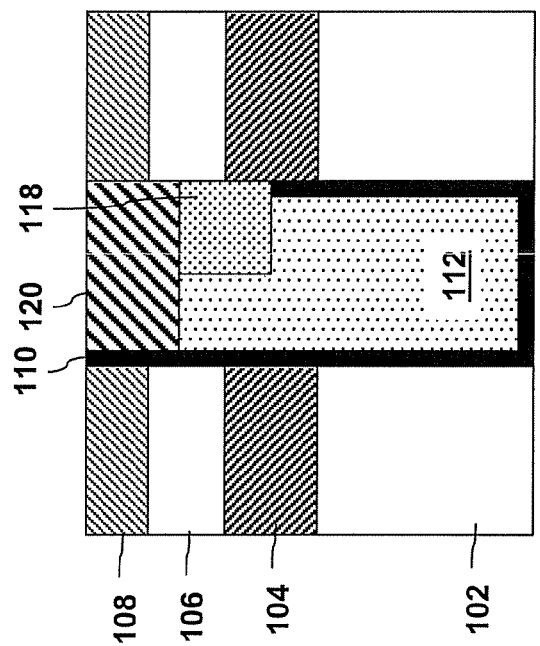

As then shown in FIG. 1(g), a shallow trench isolation (STI) process (e.g., oxide deposition followed by chemical mechanical polishing (CMP)) is then implemented to form a trench top oxide (TTO) layer 120 that electrically isolates the deep trench capacitor from a pass word line (PWL), not associated with that deep trench capacitor but which is formed directly above. Finally, in FIG. 1(h), the memory cell structure is completed at the substrate level after removal of the pad nitride layer (and upper portions of the node dielectric 110 and TTO layer 120). Then, the gate structures of the pass word line 122 and the active word line (AWL) 124 (which is associated with the deep trench capacitor shown in the figures) are formed, as well the contact electrode (CA) 126 associated with the one of the source/drain diffusions 128 of the cell transistor.

Figure 1I:
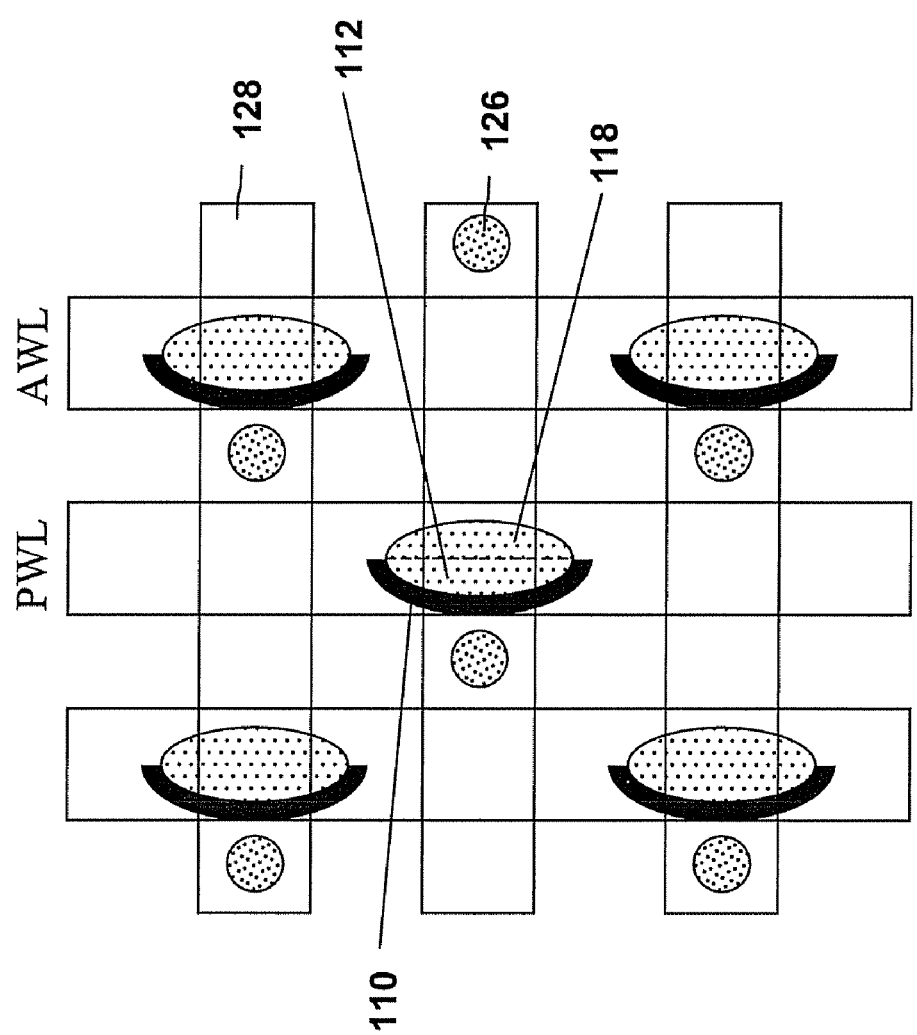
FIG. 1(i) is a top view illustrating the layout of an SOI trench memory device with a single-sided buried strap, formed in accordance with the embodiment of FIGS. 1(a) through 1(h)

FIG. 1(i) is a top view illustrating the layout of a resulting SOI trench memory device with a single-sided buried strap, formed in accordance with the embodiment of FIGS. 1(a) through 1(h). The view of the trench is taken along the lines "i-i" in FIG. 1(h), and particularly illustrates the node dielectric 110 insulating the trench polysilicon material 112 from the active area (AA) 128 SOI material on one side of the trench, while the buried strap material 118 contacts the AA SOI material on the other side of the trench.

Figure 2B:
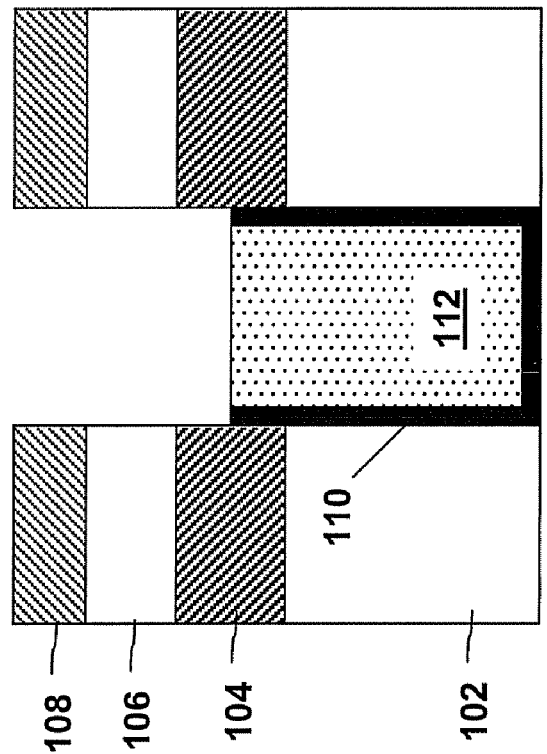
Figure 2A:
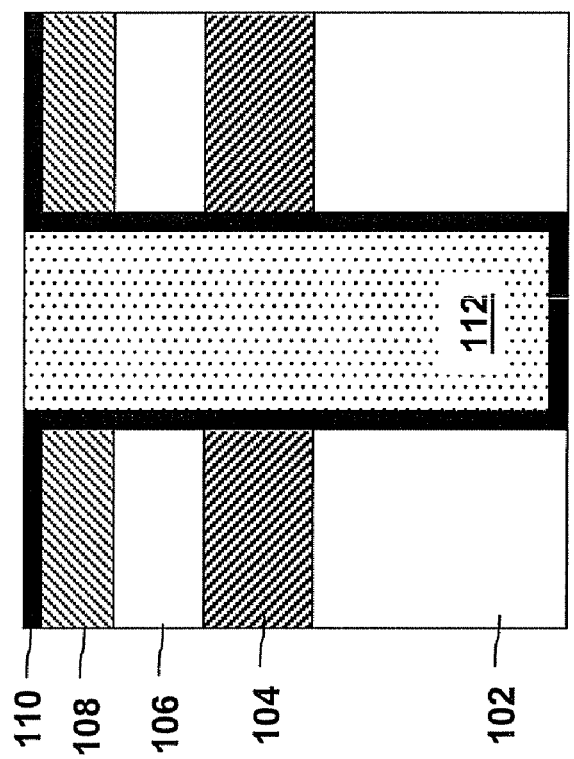
Figure 2F:
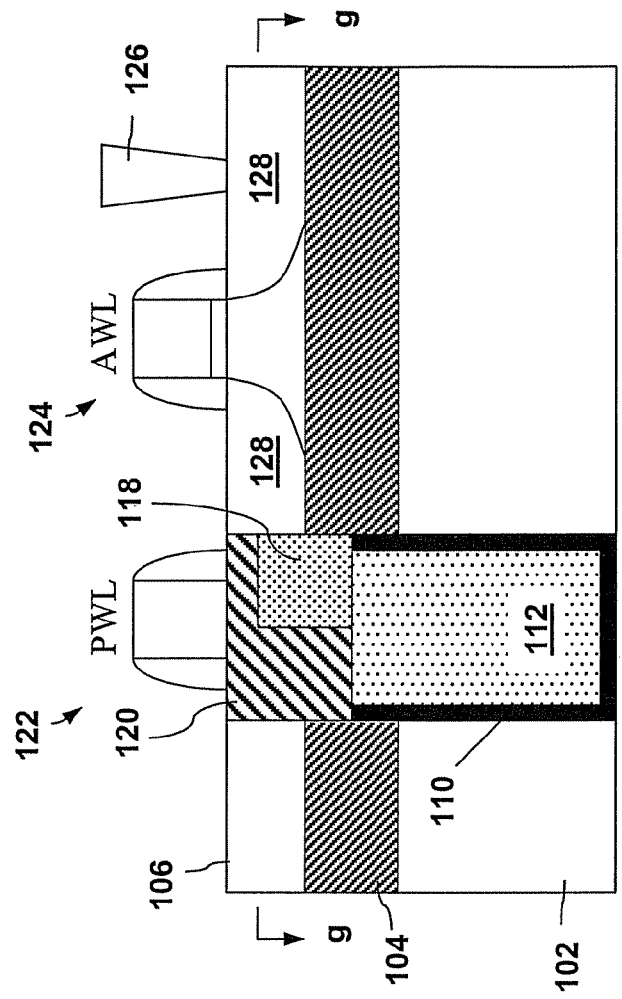

Referring now to FIGS. 2(a) through 2(f), there is shown are a series of cross sectional views illustrating a method of forming an SOI trench memory device with a single-sided buried strap, in accordance with an alternative embodiment of the invention. For ease of illustration and consistency of description, reference numbers of elements and materials with respect to the first exemplary embodiment are also used to describe the same or similar elements and materials of the second exemplary embodiment. Beginning in FIG. 2(a), a cell capacitor for an SOI trench memory device is shown, as is the case in the embodiment of FIG. 1(a). However, in contrast to the first embodiment, a strap mask is not used at this point to selectively remove a portion of the trench polysilicon material 112 and node dielectric 110 on one side of the trench. Rather, FIG. 2(b) illustrates the partial recess of both the trench polysilicon material 112 and node dielectric 110 around the entire trench, down to a level at least below the SOI layer 106.

As then shown in FIG. 2(c), a layer of buried strap polysilicon 116 is deposited and recessed to a level below pad nitride 108 and below the top surface of the SOI layer 106. Initially, the buried strap polysilicon layer 116 is formed around the entire trench. Then, as shown in FIG. 2(d), the strap mask 114 is used to cover half the trench (notably, the opposite half as that of the first embodiment). In this case, the patterned mask 114 is used to protect that portion of the buried strap polysilicon layer 116 that is to remain and form the single-sided buried strap 118, as also shown in FIG. 2(d). The exposed portion of the buried strap polysilicon layer 116 in contact with the SOI layer 116 on the opposite side of the trench is thus removed.

Figure 2E:
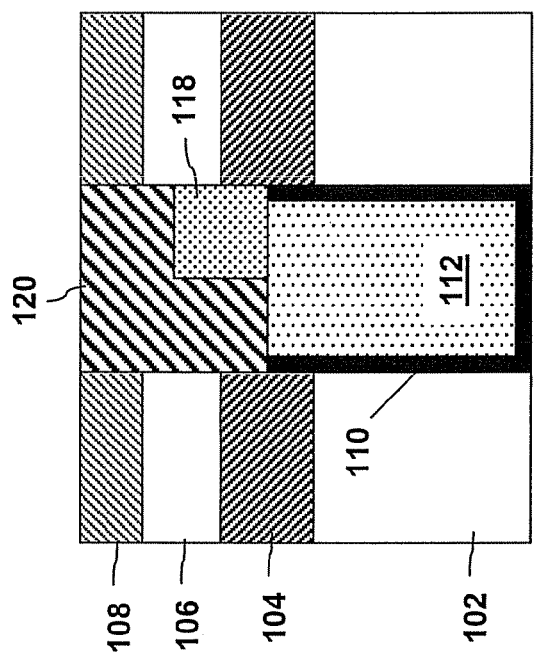

FIG. 2(e) illustrates the formation of TTO layer 120, for example, through STI processing techniques. In addition to isolating the capacitor from a pass word line directly above, the TTO layer 120 also occupies the volume created during removal of the buried strap polysilicon material 116 in FIG. 2(d), so as to isolate the capacitor from the SOI layer 106 on the opposite side of the trench with respect to the buried strap 118. Finally, in FIG. 2(f), the memory cell structure is completed at the substrate level after removal of the pad nitride layer and upper portions of the TTO layer 120. Then, the gate structures of the pass word line 122 and the active word line 124 are formed, as well the contact electrode 126 associated with the one of the source/drain diffusions 128 of the cell transistor.

Figure 2G:
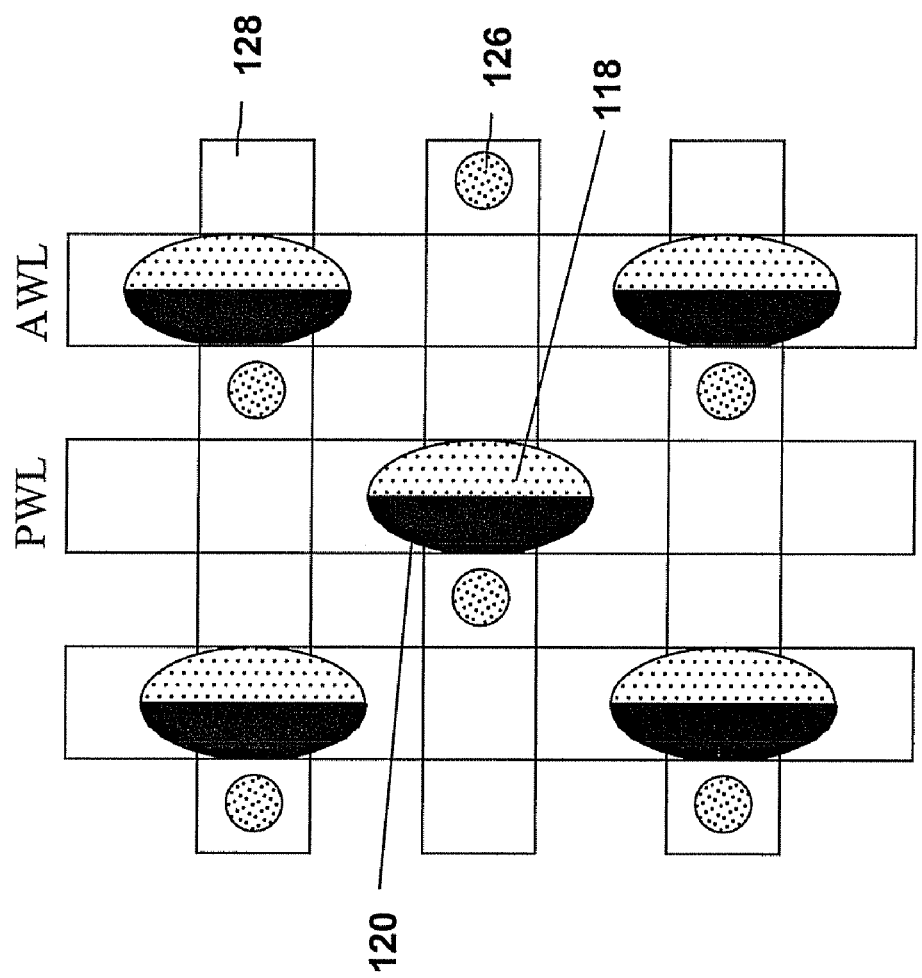
FIG. 2(g) is a top view illustrating the layout of an SOI trench memory device with a single-sided buried strap, formed in accordance with the embodiment of FIGS. 2(a) through 2(f).

FIG. 2(g) is a top view illustrating the layout of a resulting SOI trench memory device with a single-sided buried strap, formed in accordance with the embodiment of FIGS. 2(a) through 2(f). The view of the trench is taken along the lines "g-g" in FIG. 2(f), and particularly illustrates the TTO 120 insulating the trench polysilicon material from the active area (AA) 128 SOI material on one side of the trench, while the buried strap material 118 contacts the AA SOI material on the other side of the trench.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method of forming a trench memory device, the method comprising:

forming a trench capacitor within a silicon-on-insulator (SOI) substrate, the trench capacitor including a node dielectric layer formed within a trench and a trench polysilicon material formed within the trench in contact with the node dielectric layer, the trench polysilicon material serving as a capacitor electrode;

forming a strap mask so as cover one side of the trench, wherein the strap mask covers about one-half the trench;

recessing the exposed side of the trench polysilicon material, down to a level at least below an SOI layer of the SOI substrate;

removing a portion of the node dielectric layer exposed by the recessing of the trench polysilicon;

filling a volume of the trench vacated by the removed portion of the node dielectric layer and recessed trench polysilicon material with a polysilicon buried strap material;

following removal of the strap mask, further recessing previously covered portions of the trench polysilicon material and the polysilicon buried strap material, thereby defining a single-sided buried strap; and forming a trench top oxide (TTO) material over the single-sided buried strap and the trench polysilicon material, wherein the node electric layer serves as an insulator to prevent electrical contact between the SOI layer and the trench polysilicon material in the other side of the trench with respect to the location of the single-side buried strap.

* * * * *